United States Patent [19]

Christian et al.

[11] Patent Number: 4,472,875

[45] Date of Patent: Sep. 25, 1984

[54] METHOD FOR MANUFACTURING AN INTEGRATED CIRCUIT DEVICE

[75] Inventors: Raymond R. Christian, Oaklawn; Harry Sue, Chicago; Joseph C. Zuercher, Wilmette, all of Ill.

[73] Assignee: Teletype Corporation, Skokie, Ill.

[21] Appl. No.: 508,316

[22] Filed: Jun. 27, 1983

[51] Int. Cl.[3] ...................... H01L 21/78; H01L 21/95

[52] U.S. Cl. .................................... 29/577 C; 29/571; 29/583; 29/588; 357/51; 357/80; 219/216; 346/76 PH

[58] Field of Search ..................... 29/571, 577 C, 583, 29/588, 589; 357/51, 54, 80; 219/216 PH, 543; 338/308, 309; 346/76 PH, 139 C; 156/631, 632, 662

[56] References Cited

U.S. PATENT DOCUMENTS 3,852,563 12/1974 Bohorquez et al. ........... 346/76 PH 3,889,358 6/1975 Bierhenke ............................ 357/51

4,110,598 8/1978 Small ............................. 346/76 PH 4,134,125 1/1979 Adams et al. ......................... 357/54

4,266,334 5/1981 Edwards et al. ...................... 29/583

*Primary Examiner*—Aaron Weisstuch

*Assistant Examiner*—Hunter L. Auyang

*Attorney, Agent, or Firm*—W. K. Serp

[57] ABSTRACT

A method for manufacturing an integrated circuit thermal print head is illustrated including transistor 20 and a resistor doped region 22 formed on a first surface of a silicon circuit wafer 10. A contamination barrier in the form of a moat 26 filled with silicon nitride 30 is formed around the transistor 20. A support wafer 50 is secured to the first surface of the circuit wafer 10 by an adhesive layer 58. The circuit wafer 10 is thinned, and the exposed surface of the circuit wafer 10 is photoshaped to define wafer segments 68 positioned over the resistor doped region 22.

6 Claims, 3 Drawing Figures

METHOD FOR MANUFACTURING AN INTEGRATED CIRCUIT DEVICE

DESCRIPTION

TECHNICAL FIELD

This invention relates to a method for manufacturing an integrated circuit device.

BACKGROUND ART

One type of printer is the thermal printer in which an element is selectively heated. The heat is transferred either to a chemically treated paper medium or to a film with a layer of heat fusable ink. In the first instance, the chemical composition of the surface of the paper changes in response to localized heating producing visible indicia. In the second instance, ink on the film is melted and absorbed by plain paper in contact with the film. Many devices have been used to generate the localized heat necessary to produce the indicia. Bipolar integrated circuits have been used. Such bipolar integrated circuits often include a small piece of heat conductive material placed over a heating element such as a silicon controlled rectifier. The heat conductive material transfers heat from the heating element to the paper as it is drawn across the print head. Heretofore, the relative alignment of the heat conductive material to the heating element has been particularly difficult; and thus, the fabrication of such integrated circuits has been expensive.

DISCLOSURE OF THE INVENTION

In accordance with this invention, a method is provided for manufacturing an integrated circuit device. A thin film of adhesive is placed between a first circuit carrying surface of a circuit wafer and a first surface of a support wafer so as to cause the two wafers to adhere together forming a wafer sandwich. An opening is etched through the circuit wafer to expose an alignment pattern. The circuit wafer is photoshaped using the alignment pattern to produce thermally isolated circuit wafer sections over selected areas of the integrated circuit. Finally, the wafer sandwich is sliced into integrated circuit chips.

Preferably, the integrated circuit includes an active circuit and a passive heating element controlled by the active circuit. The active circuit is surrounded by a contamination barrier. Desirably, the thickness of the circuit wafer is reduced after forming the wafer sandwich. The second surface of the support wafer is coated with silicon nitride and the water sandwich is placed into a bath which etches the silicon from the first surface of the circuit wafer.

THE DRAWING

FIGS. 1 through 3 arranged as shown in FIG. 4 illustrate sequential process steps for manufacturing an integrated circuit device in accordance with this invention.

DETAILED DESCRIPTION

Figure 1:
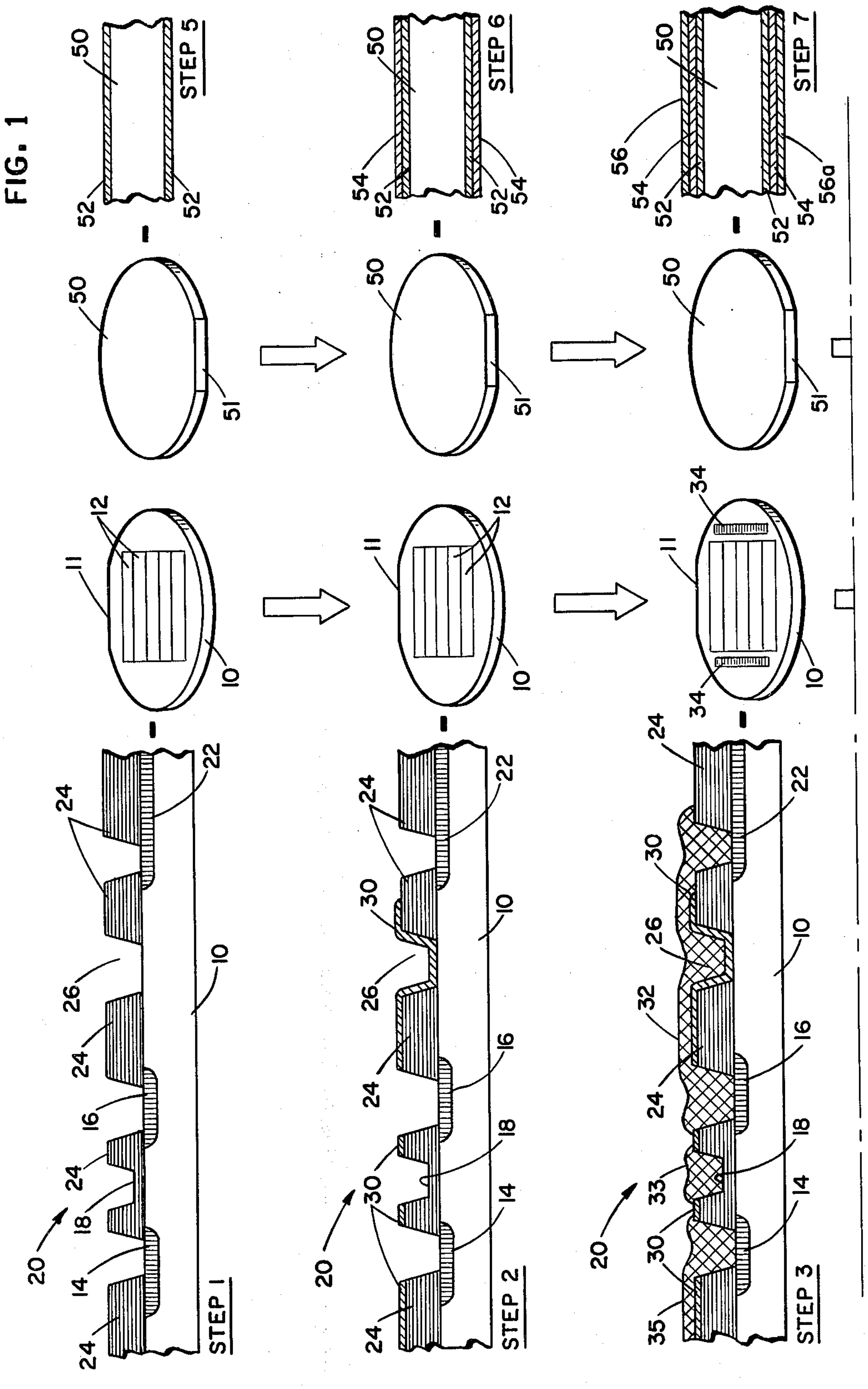
Figure 2:
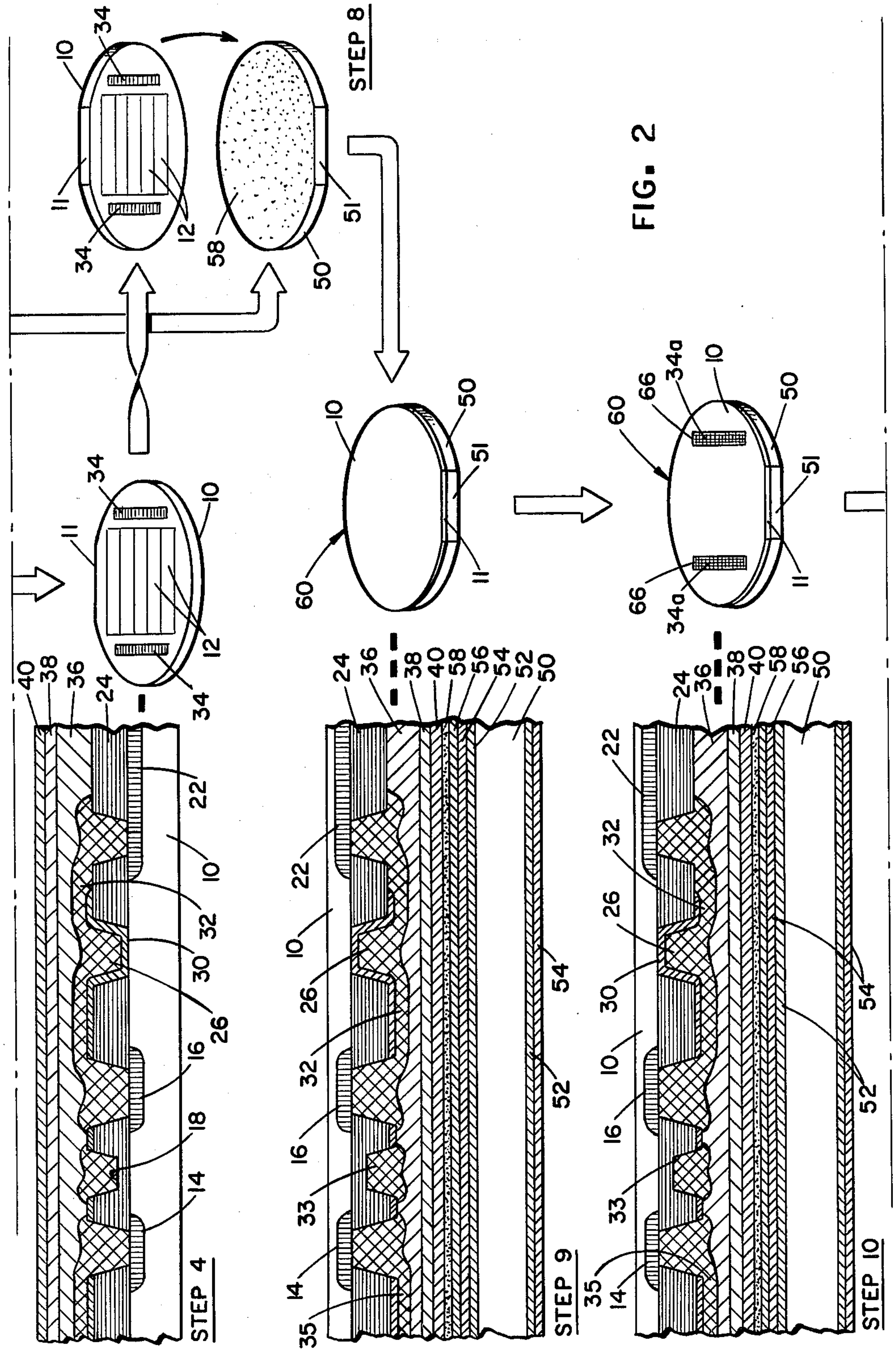
Figures 3, 4:
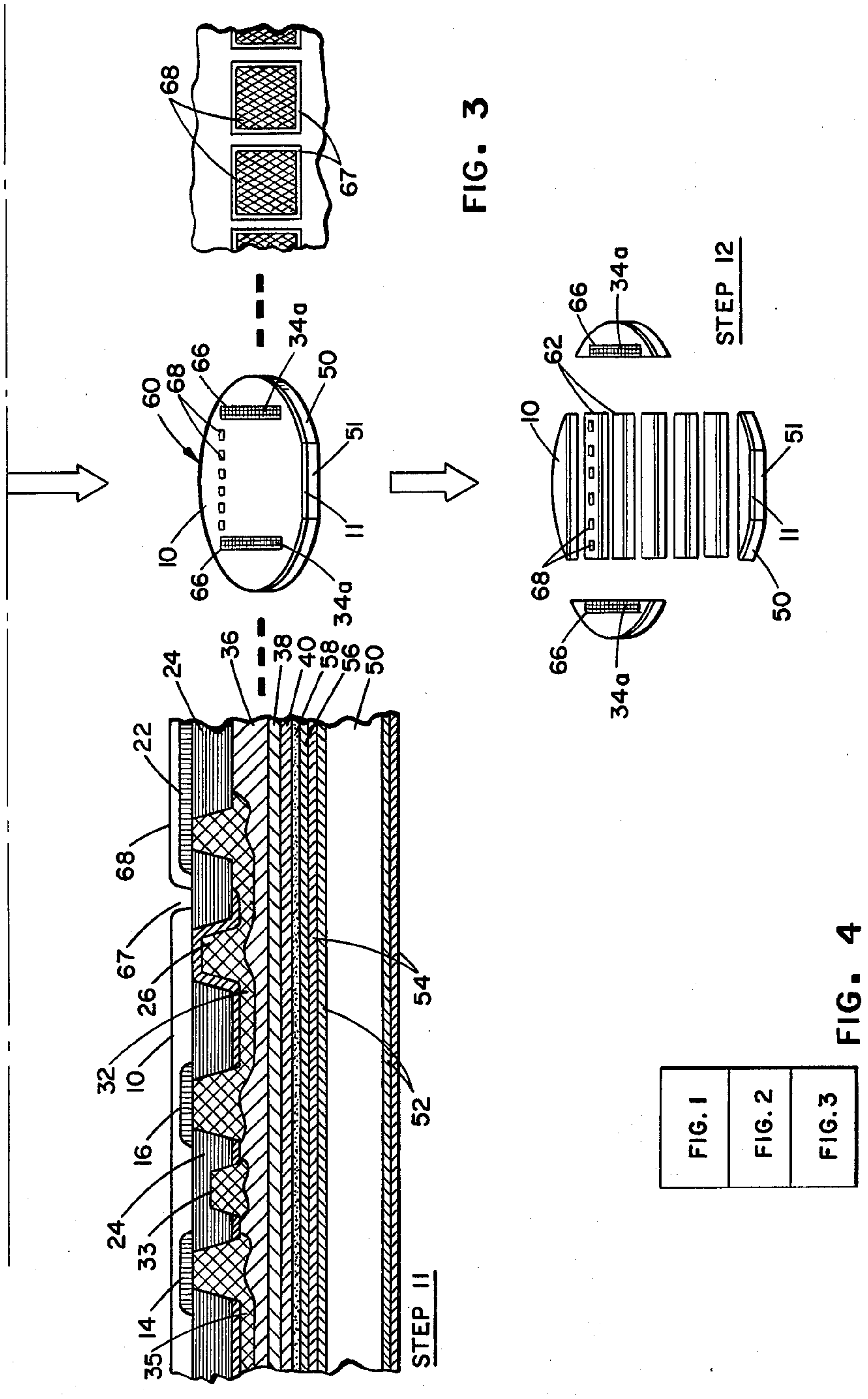

As shown in Step 1 of FIG. 1, an N-type silicon wafer 10 having a major flat 11 has processed therein several individual integrated circuits 12 produced by MOS (Metal Oxide Semiconductor) processing techniques. The integrated circuit illustrated is particularly adapted for thermal printing on a paper medium (not shown). It is preferred that the wafer 10 have a <100> crystalline orientation to facilitate etching as will be subsequently considered. A portion of one of the integrated circuits 12 is illustrated in the partial sectional view in Step 1 and includes source-drain doped regions 14 and 16 as well as a gate region 13, the combination forming a transistor 20. Obviously, the drawing is not to scale and is exaggerated vertically to more clearly illustrate certain features. Additionally, another doped region 22 in the surface of the wafer forms a resistor. The doped region 22 is preferably formed with the source-drain doped regions 14 and 16. Field oxide 24 is grown and photoshaped on the surface of the wafer 10. A recess or moat 26 is photoshaped into the field oxide 24. The moat 26 surrounds and isolates the transistor 20, forming the active circuit, from the passive resistor doped region 22. In Step 2, the surface of the wafer 10 is covered with a layer of silicon nitride 30 which is thereafter photoshaped and allowed to cover the moat 26. The moat 26, covered with the silicon nitride 30, provides a barrier or edge seal excluding environmental contaminants, such as sodium, from the active transistor 20.

In Step 3, metallic conductors 32, 33, 35 of suitable material such as aluminum are photoshaped at desired locations on the wafer 10. The conductor 32 crosses the moat 26 and connects the transistor 20 to the resistor doped region 22. Simultaneously, alignment marks 34 are photoshaped outside the usable chip area at two selected locations upon the wafer 10, which will be used in subsequent processing steps. In Step 4, the wafer 10 is covered with a silicon dioxide layer 36 followed by a silicon nitride layer 38 which is followed by a second silicon dioxide layer 40. This triple passivation layer provides a barrier to the migration of sodium and other environmental contaminants. The final silicon dioxide layer 40 also provides a compatible interface medium to an adhesive layer to be applied in a subsequent processing step.

In Step 5, a support wafer 50 having a major flat 51 is prepared by exposing it to an oxidizing environment at an elevated temperature causing the growth of silicon dioxide layers 52 upon the exposed surfaces of the wafer 50. In Step 6, a silicon nitride layer 54 is deposited upon the surfaces of the wafer 50; and, in Step 7, silicon dioxide layers 56 and 56*a* are formed upon the surfaces of the carrier wafer 50 by oxidizing the nitride layer 54. The silicon dioxide layer 56 provides a compatible surface medium for an adhesive layer 58 applied in Step 8. The adhesive layer 58 may be coated on the silicon dioxide layer 56 of the support wafer 50 by various techniques well known in the art. A particularly suitable technique is that of spinning the adhesive on the wafer 50 and thereafter out-gassing the adhesive 58 by placement of the wafer 50 into an evacuated chamber (not shown).

In Step 8, the circuit wafer 10 and the support wafer 50 are brought together in a vacuum to avoid air entrapment. The adhesive 58 is cured at a high temperature resulting in a unitary wafer sandwich 60. In Step 9, the thickness of the circuit wafer 10 is reduced by placing the wafer sandwich 60 into a potassium hydroxide etchant bath. The etchant bath also removes the silicon dioxide layer 56*a* from the exposed surface of the support wafer 50. This etchant bath preserves the parallelism of the circuit wafer 10 which is initially selected to be very flat. In this manner, the thickness uniformity of the wafer 10 is maintained. Other etchant baths are also suitable. The silicon nitride outer layer 54 of the wafer 50 resists the etching solution. It will be appreciated that, as shown in the sectional view of Step 9, the active transistor 20 is sealed from sodium and other contaminants primarily by the nitride coated moat 26 and the silicon nitride surface coating 38.

In Step 10, openings 66 are photoshaped into the circuit wafer 10 exposing alignment patterns 34*a* which are the relief images in the adhesive 58 of the patterns 34 as shown in the adhesive 58. The location of the wafer flats 11 and 51 are used as coarse alignment indicators during the photoshaping of the openings 66. In Step 11, a trough is etched through the circuit wafer 10 defining rectangular shaped segments 68 as illustrated in the enlarged fragmentary top view in Step 11. The segment 68 is located over the resistor doped region 22. During etching, the walls form an angle of 54.76 degrees with the plane of the wafer 10 surface. This particular angle is characteristic of <100> crystalline orientation silicon. The reduction in the thickness of the circuit wafer in Step 9 allows closer spacing of the segments than would otherwise be possible. Each segment 68 is accurately positioned over its associated resistor doped region 22. In Step 12, the wafer sandwich 60 is sliced into discrete integrated circuit print head chips 62.

While this invention has been particularly shown and described in connection with an illustrated embodiment, it will be appreciated that various changes may be made without departing from the spirit and scope of the invention as set forth in the following claims.

What is claimed is:

1. A method for manufacturing an integrated circuit device comprising the steps of:

(A) processing a silicon circuit wafer (10) to form an integrated circuit (12) and at least one alignment pattern (34) on a first surface of the circuit wafer (10), said integrated circuit (12) includes an active circuit (20) and a passive heating element (22) controlled by said active circuit (20);

(B) surrounding the active circuit (20) with a barrier (26, 30) to environmental contaminants;

(C) preparing the surface of a support wafer (50) for subsequent processing;

(D) positioning the first surface of the circuit wafer (10) opposing a first surface of the support wafer (50);

(E) forming a layer of adhesive (58) on the opposing first surfaces of said circuit (10) and said support (50) wafers so as to cause the two wafers to adhere together forming a wafer sandwich (60);

(F) photoshaping an opening (66) through the circuit wafer (10) to expose indicia (34*a*) corresponding to the alignment pattern (34);

(G) photoshaping the circuit wafer (10) using the indicia (34*a*) exposed in Step F to produce an isolated circuit wafer section (68) disposed over said passive heating element (22); and (H) slicing the wafer sandwich (60) into integrated circuit chips (62).

2. The method of claim 1 which further includes the step of thinning the circuit wafer (10) prior to Step G to reduce the thickness of the wafer segments (68).

3. The method of claim 1 which further includes the step of placing a layerof material (36), which provides a barrier to environmental contaminants, over the surface of the circuit wafer (10) prior to Step E.

4. The method of claim 3 wherein the circuit wafer (10) has a <100> crystalline structure.

5. The method of claim 1 which further includes outgassing the adhesive (58) applied in Step E prior to adhesion of the wafers (10, 50) into a wafer sandwich (60).

6. The method of claim 1 wherein the barrier (26, 30) is in the form of a moat (26) filled with silicon nitride (30).

* * * * *